United States Patent [19]

Bynum et al.

[11] Patent Number: 4,893,211
[45] Date of Patent: Jan. 9, 1990

[54] METHOD AND CIRCUIT FOR PROVIDING ADJUSTABLE CONTROL OF SHORT CIRCUIT CURRENT THROUGH A SEMICONDUCTOR DEVICE

[75] Inventors: Byron G. Bynum; Robert B. Jarrett, both of Tempe, Ariz.

[73] Assignee: Motorola, Inc., Schaumburg, Ill.

[21] Appl. No.: 718,416

[22] Filed: Apr. 1, 1985

[51] Int. Cl.$^4$ .............................................. H02H 9/02
[52] U.S. Cl. ........................................ 361/18; 361/86; 361/91; 361/87; 361/107; 323/278
[58] Field of Search ........................ 361/18, 52, 86, 91, 361/88, 93, 94, 98, 100, 101, 58; 323/278, 277, 276, 279

[56] References Cited

U.S. PATENT DOCUMENTS

| | | | |
|---|---|---|---|
| 3,582,713 | 6/1971 | Till | 361/18 X |
| 3,851,218 | 11/1974 | York | 361/101 |
| 4,021,701 | 5/1977 | Davies | 361/18 |
| 4,180,768 | 12/1979 | Ferraro | 323/278 |
| 4,254,372 | 3/1981 | Moore, Jr. | 361/18 X |

Primary Examiner—Todd E. DeBoer

[57] ABSTRACT

A method for limiting short circuit current flow in a Field Effect Transistor (FET) to limit the power dissipated therein includes sensing a rise in the drain-to-source voltage of the transistor and clamping the gate-to-source voltage to a predetermined adjustable value thereby reducing the magnitude of the short circuit current flow to within the safe operating characteristics of the device. A comparator switch circuit is responsive to the drain-to-source voltage of the FET exceeding a reference voltage value for clamping the gate-to-source voltage to a predetermined reduced voltage. A trimmable resistive network is connected between the gate and the source electrode of the transistor for adjusting the gate to source clamped voltage potential to compensate for variations in transistor transconductances from one transistor to the next that they may be used in conjunction with the electronic circuitry.

4 Claims, 1 Drawing Sheet

METHOD AND CIRCUIT FOR PROVIDING ADJUSTABLE CONTROL OF SHORT CIRCUIT CURRENT THROUGH A SEMICONDUCTOR DEVICE

BACKGROUND OF THE INVENTION

The present invention relates to overload protection circuitry and, more particularly, to a circuit and method for limiting the power dissipated in a semiconductor device during short circuit load conditions.

Power transistors are commonly used in circuits to provide a series conduction path between a source of operating potential and a load. These circuits are referred to as series-pass or high side driver circuits. For example, the automotive industry utilizes different types of high side driver circuits to provide a myriad of functions. A typical high side driver circuit has the two main electrodes of the transistor series connected between the positive, or high side, of the battery and the load with the transistor control electrode driven by electronic control circuitry to render the transistor conductive to source current to the load. A feature of such circuits is that the "on" resistance of the transistor is minimal in order that very little voltage is dropped thereacross. Thus, the load is effectively connected to the high side of the battery.

At least one automotive manufacturer has proposed using a power Field Effect Transistor (FET) in such a high side driver circuit. In this application the drain and source electrodes are connected between the battery and the load respectively. The gate electrode is connected to electronic control circuitry including a charge pump circuit for supplying a gate-to-source drive voltage, $V_{GS}$, of sufficient magnitude to render the FET conductive during normal operation such that the "on" resistance of the device is minimal, i.e., only a few tenths of an ohm. As understood, the charge pump circuit can develop a VGS of several magnitudes greater than the battery voltage: typically 25 to 30 volts. Hence, the FET can supply eight to ten amperes of current to the load with minimal voltage drop thereacross. A typical value of VDS, the drain-to-source voltage potential of the FET under normal operating conditions is less than a hundred millivolts. Thus, the FET power dissapation is well within the safe operating conditions of the device.

A problem occurs if the load that is coupled to the source electrode of the power FET in the above described circuit should become an effective short circuit. Under this condition the voltage across the FET could approach the battery potential which, in conjunction with VGS being between 25-30 volts, can cause over 600 watts to be dissipated across the FET due to in rush currents of greater than 60 amperes flowing therethrough. Hence, the FET could be seriously damaged or even destroyed.

It is known that short circuit current flow in the FET can be limited to reduce the power dissapation therein by voltage source driving the FET gate electrode with respect to the source electrode under certain conditions. Hence, by controlling $V_{GS}$ of the FET in the saturated operating region the source current can be controlled. The source current then is substantially constant to a first order and is independent of $V_{DS}$, the drain-to-source voltage.

However, because of present day process tolerances, it is not uncommon to find the transconductance of power FET's varying from FET to FET and process to process. Hence, it is not uncommon to discover that the short circuit current flow through the same circuitry using a different FET connected therewith can vary widely with a given VGS. This condition is very undesirable since it may be necessary to limit the short circuit current of the FET to a minimal value in order to protect the FET during short circuit load conditions.

Hence, a need exists for a circuit and method for adjusting the short current flow in a power FET connected to the circuit to a predetermined maximum value in order to limit the power dissipation therein.

SUMMARY OF THE INVENTION

Accordingly, it is an object of the present invention to provide an improved method and circuit for limiting the power dissipation in a semiconductor device during short circuit load conditions.

Another object of the present invention is to provide an improved method for adjustably controlling the short circuit current flow through a semiconductor device.

Still another object of the present invention is to provide a method for adjustably controlling short circuit current flow through a power field effect transistor (FET).

Yet another object of the present invention is to provide circuitry for clamping the gate to source voltage of a power FET to a predetermined adjustable value.

Still yet another object of the present invention is to provide protection circuitry responsive to an increase in the drain to source voltage of a power FET for clamping the gate-to-source voltage to a predetermined adjustable value.

A further object of the present invention is to discharge the stored gate capacitance of a power FET as quickly as possible.

In accordance with the above and other objects there is provided a method for limiting the power dissipation in a FET, having its drain-to-source connected in a conduction path in series with a load, under short circuit conditions comprising the steps of sensing the drain-to-source potential and clamping the gate to source voltage to a predetermined adjustable value in response to the drain to source potential exceeding a predetermined value.

It is one aspect of the invention that circuitry is provided that is responsive to an increase in the drain-to-source voltage of the FET for limiting the power dissipation therein which comprises sensing circuitry responsive to an increase in the drain of source voltage for clamping the gate to source voltage of the device to a predetermined value and adjustable circuit means coupled between the sensing circuitry and the source electrode of the FET for adjusting the voltage developed therebetween within a predetermined range to limit the current flow through the FET.

DETAILED DESCRIPTION OF THE PREFERRED EMBODIMENT

Figure 1:
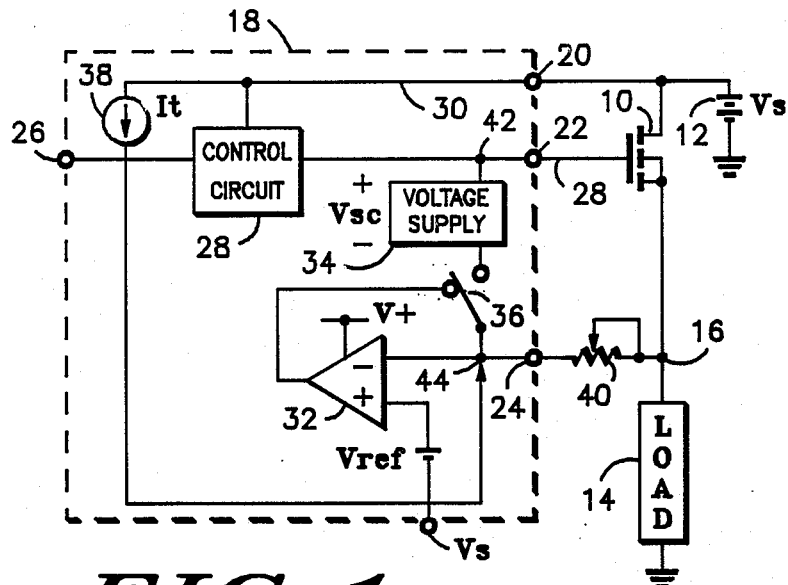
FIG. 1 is a partial schematic and block diagram of a high side driver circuit including circuitry of the present invention for limiting the power dissipation of a semiconductor device connected to the high side driver circuit under short circuit load conditions.

Turning to the FIGS. there is illustrated circuitry for clamping the gate to source voltage, VGS, of power FET 10 to a predetermined adjustable value under short circuit load conditions as will hereinafter be explained. As illustrated, the drain and source electrodes of FET 10 are coupled respectively between power source 12 and load 14 to provide a current conduction path therebetween whenever FET 10 is rendered conductive. Load 14 is connected to the source electrode of FET 10 at node 16. FET 10, in conjunction with electronic circuitry 18, comprises a high side driver circuit for supplying load current to load 14 the operation of which is generally understood. Electronic circuitry 18, which is suited to be manufactured in monolithic integrated circuit form, is connected to power supply 12 at external terminal 20. Electronic circuitry 18 includes external terminals 22 and 24 connected to the gate electrode of FET 10 and adjustable resistive circuit means 40 respectively. In operation, control circuit 28 which is coupled via lead 30 to terminal 20 and receives the operating potential $V_S$ is enabled by a control signal supplied to terminal 26 to render FET 10 conductive during normal operating conditions. Among other features, control circuitry 28 includes a common type charge pump circuit for generating voltage drive to the gate of FET 10 at terminal 22. The voltage drive established by control circuit 28 is sufficient to ensure that the "on" resistance of FET 10 is very small, i.e., on the order of a few tenths of an ohm. Typically, the voltage drive supplied to terminal 22 is of a value of two to three times that of, $V_S$ i.e., 25 to 30 volts. Thus, during normal operating conditions a current is sourced to node 16 from FET 10 of approximately 8 to 10 amperes as controlled by $V_S/R_L$, $R_L$ being the load resistance. With a few tenths of an ohm "on" resistance, substantially all of the power supply voltage, $V_S$, of battery 12 is dropped across load 14. Hence, the power dissipated by FET 10 under these conditions is well within the safe operating characteristics thereof.

Under abnormal load conditions, for instance, load 14 becoming short circuited, the voltage potential at node 16 decreases to nearly zero volts which means that VDS, the drain-to-source voltage of FET 10, rises nearly to the value of $V_S$. Concurrently, $I_S$, the current flowing through FET 10 with load 14 short circuited, can increase by several orders of magnitude with the voltage $V_{GS}$ being at the potential of two to three times $V_S$. It is not unusual to see an in rush short circuit current value of 60 amperes or more flowing through FET 10. This condition can cause the power dissapation of FET 10 to greatly exceed its safe operating characteristics, e.g., under the aforedescribed conditions more than 600 watts would be dissipated by FET 10. This condition can cause FET 10 to be seriously damaged or even destroyed.

In order to protect FET 10 from being damaged or even destroyed under short circuit current conditions, the current flow through FET 10 must be limited to a safe maximum value as quickly as possible in order to limit the power dissipation therein. Accordingly, overload protection circuitry is provided by the subject invention which clamps the gate to source voltage, $V_{GS}$, supplied to the gate of FET 10 to a predetermined value less than the gate voltage drive supplied during normal operating conditions. Hence, the short circuit current flow through FET 10 is reduced to a value that can be safely handled by the device. The method for providing short circuit protection to limit the power dissipation in FET 10 will now described.

The overload protection circuitry of the preferred embodiment includes comparator switching circuitry comprising comparator 32 in conjunction with switch 36 for coupling a voltage $V_{SC}$ provided by voltage supply 34, between the gate of FET 10, at node 42, and output terminal 24. In addition, an external trimmable resistive or voltage circuit means 40 is connected between terminal 24 and node 16 which allows the voltage between the gate and source of FET 10 to be adjusted during short circuit load conditions. As illustrated, a current source 38 supplies a current $I_t$ to terminal 24 which produces a potential drop across trimmable resistor 40. In addition, the non-inverting input terminal of comparator 32 is connected to a reference potential $V_{ref}$ while the inverting input terminal is connected at node 44 to trimmable resistor 40 via output terminal 24. In this manner, a voltage is developed across trimmable resistive circuit 40 the value of which can be varied by varying the value of the resistance of resistive circuit 40. In operation, as long as the voltage appearing at node 44 is greater than the value $V_{REF}$ comparator 32 remains in a state such that switch 36 is open. In this condition, $V_{GS}$ is supplied directly to the gate electrode of FET 10 at node 42 by control circuit 28 as described above whereby FET 10 supplies normal load current to load 14.

If, however, the voltage potential at node 16 and hence node 44 decreases below the value of $V_{REF}$ the output level state of comparator 32 is caused to switch. Thus, comparator 32 is responsive to an increase in the drain to source voltage potential across FET 10. A decrease in the voltage potential at node 16 and, consequently, a rise in the drain of source voltage of FET 10 occurs if load 14 becomes short circuited. The change in the output state of comparator 32 in response to the rise in the drain-to-source potential causes switch 36 to close. When switch 36 closes, the voltage between the gate and source of FET 10 is clamped substantially to the value of $V_{SC}$ plus a transistor saturation voltage and the potential across resistor 40. The value of this clamp voltage is programmable and is sufficiently lower than the normal voltage drive supplied to the gate of FET 10 such that short circuit current flow through FET 10 is reduced to a value within the safe operating characteristics of the device. By utilizing trimmable resistor means 40 lot-to-lot process variations in the transconductance of different FET's that may be connected to circuit 18 at terminals 20, 22 and 24 may be compensated for by adjusting the voltage potential drop across resistor means 40. Thus, by adjusting the resistance value of resistor means 40 the value of $V_{GS}$ during clamp operating conditions can be adjusted over a predetermined range while monitoring the short circuit current flow through the FET connected to circuit 18 to ensure that the value of this current is limited to a predetermined acceptable value. Thus, the overload protection circuitry of the present invention can be utilized with any FET and is not-dependent on the transconductance thereof.

Figure 2:
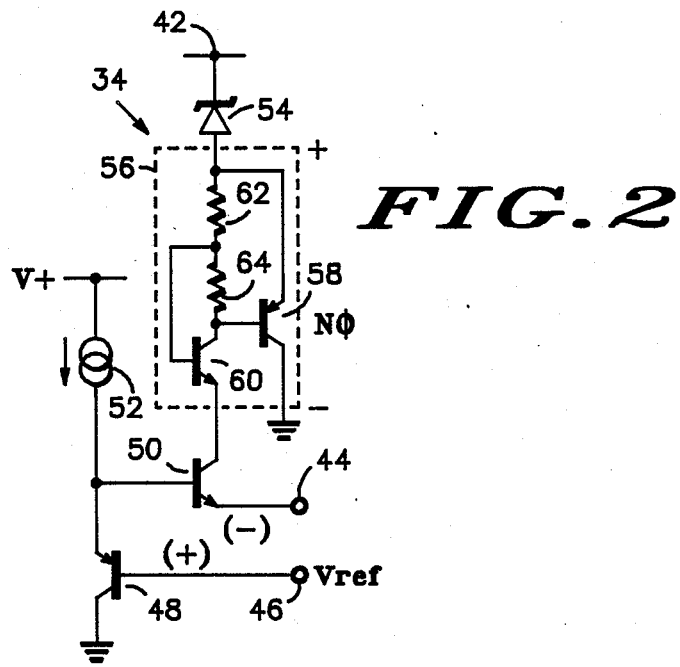
FIG. 2 is a more detailed schematic of the preferred embodiment of the circuit of the present invention that is illustrated in FIG. 1.

Turning now to FIG. 2, components of the aforedescribed overload protection circuit of the preferred embodiment are shown in more detail. Comparator 32 and switch 36 are realized in a combined comparator switch circuit which includes PNP transistor 48 and NPN transistor 50 in conjunction with current source 52. In normal operation the voltage potential applied to node 44, at the emitter of transistor 50, is greater than the value of $V_{REF}$ applied to the base of transistor 48 at node 46 and the latter is rendered conductive to sink all of the current sourced from current source 52 while transistor 50 is rendered non-conductive. However, when the voltage at node 44 becomes less than $V_{REF}$, due to load 14 becoming short circuited for instance, transistor 48 is turned off while transistor 50 is turned on to provide electrical connection between node 42 and node 44 via zener diode 54 and NO circuit 56, i.e., $V_{SC}$. The total potential drop supplied across the drain-to-source of FET 10 is then equal to the sum of the zener voltage of zener diode 54, the potential of NO circuit 56, the saturation voltage of transistor 50 and the potential drop across resistor circuit means 40. By trimming or adjusting resistor circuit means 40 while monitoring short circuit load conditions $V_{DS}$ can be adjusted to limit the value of the current flow through FET 10. Transistor 50 acts as a semiconductor switch connecting the short circuit clamp voltage $V_{SC}$ to node 44.

For explanation, NO circuit 56 is illustrated as including PNP transistor 56 having its emitter and base coupled across series connected resistors 62 and 64 and its collector coupled to ground reference. Series connected resistors 62 and 64 are coupled between the anode of Zener diode 54 and the collector of NPN transistor 60, the emitter of which is connected to the collector of NPN transistor 50. The base of transistor 60 is connected between resistors 62 and 64. The gate discharge current flows to ground reference via the emitter-collector path of transistor 60 whenever the overload protection circuit is rendered operative as described above. In this manner, the gate of FET 10 is quickly discharged by providing a current path to ground and not through resistor means 40. Thus, this current does not pass through transistor 50 and hence resistor means 40 producing an undesirable offset voltage across the latter.

It is understood that any voltage, $V_{SC}$, can be produced using any combination of devices. Zener diode 54 and NO circuit 56 are illustrated for explanation purposes only and are not intended to limit the scope of the present invention. Additionally, current source 38 can be any low saturation operated current source and have any controlled temperature coefficient so that the adjustable clamp voltage can be made to track the FET temperature characteristics.

Thus, what has been described above, is a novel circuit and method for adjustably controlling the short circuit current through a power FET. The method includes sensing a rise in the drain-to-source voltage $V_{DS}$ of a FET beyond a predetermined level and clamping the gate-to-source voltage of the FET to a predetermined adjustable value in responsive to the rise in $V_{DS}$. In this manner, a short circuit condition is sensed and the short circuit flow through the FET is limited to a predetermined adjustable value such that the power dissipation in the FET is maintained within the safe operating characteristics thereof.

We claim:

1. A method used in limiting the power dissipation in a transistor having a pair of electrodes defining a current path between a power source and a load, and a control electrode, comprising the steps of:
   sensing the potential drop accurring between the pair of electrodes of the transistor; and
   clamping the voltage potential between the control electrode and one of said pair of electrodes of the transistor to a predetermined value in response to said potential drop between said pair of electrodes exceeding a predetermined value to limit the current flow through the transistor to a reduced value wherein the step of clamping the voltage potential includes comparing the voltage level appearing at said one of said pair of electrodes of the transistor to a reference voltage level and establishing both a predetermined voltage potential and an adjustable voltage potential between said control electrode and said one of said pair of electrodes of the transistor whenever said voltage level appearing at said one of said pair of electrodes decreases below said reference voltage level.

2. In combination with a transistor having a pair of electrodes defining a current conduction path between a source of operating potential and a load and a control electrode, a circuit for limiting the power dissipation in the transistor, comprising:
   a voltage supply circuit connected to the control electrode of the transistor;
   adjustable voltage source means connected to one of the pairs of electrodes of the transistor, the potential drop across said adjustable voltage source means being variable; and
   circuit means responsive to the potential drop between the pair of electrodes of the transistor exceeding a predetermined value for coupling said voltage supply circuit to said adjustable voltage source means to clamp the voltage potential between the control electrode and the one electrode of the pair of electrodes of the transistor to a predetermined adjustable value, said circuit means includes comparator switch means for operatively coupling said voltage supply circuit to said adjustable voltage source means in response to the potential drop between the pair of electrodes of the transistor exceeding said predetermined value, said comparator switch means having a pair of inputs and an output, a first one of said pair of inputs being coupled to said adjustable voltage source means, and a second one of said par of inputs being coupled to a reference potential, said output being operatively connected to said voltage supply circuit.

3. The combination of claim 2 wherein said adjustable voltage source means includes trimmable resistive means coupled between said first one input of said comparator switch means and the one electrode of the pair of electrodes of the transistor and a current source for sourcing a predetermined value of current through said trimmable resistive means.

4. The combination of claim 3 wherein said comparator switch means includes:
   a first transistor of a first conductivity type having first and second electrodes and a control electrode, said first electrode being coupled to said first input of said comparator switch means, said second electrode being coupled to said output of said comparator switch means;
   a second transistor of a second conductivity type having first and second electrodes and a control electrode, said control electrode being coupled to said second input of said comparator switch means, said second electrode being coupled to a first node at which is supplied a ground reference potential; and
   an additional current source for supplying a current of substantially constant current, said additional current source being coupled both to said control electrode of said first transistor and said first electrode of said second transistor.

* * * * *